(12) United States Patent
Zayatz

(10) Patent No.: US 6,671,187 B1
(45) Date of Patent: Dec. 30, 2003

(54) PROTECTION DEVICE HAVING A SLEEVE AND METHOD OF ASSEMBLING A BATTERY WITH A PROTECTION DEVICE AND AN ELECTRICAL COMPONENT

(75) Inventor: Robert Zayatz, North Tonawanda, NY (US)

(73) Assignee: Wilson Greatbatch Ltd., Clarence, NY (US)

( * ) Notice: Subject to any disclaimer, the term of this patent is extended or adjusted under 35 U.S.C. 154(b) by 0 days.

(21) Appl. No.: 09/667,983

(22) Filed: Sep. 22, 2000

Related U.S. Application Data

(63) Continuation-in-part of application No. 09/404,934, filed on Sep. 24, 1999, now Pat. No. 6,205,034.

(51) Int. Cl.⁷ ................................................. H01R 9/00
(52) U.S. Cl. ..................... 361/824; 361/103; 361/601
(58) Field of Search .............................. 361/103–104, 361/601, 626, 824; 429/171–172, 185; 337/186–187

(56) References Cited

U.S. PATENT DOCUMENTS

| | | | |
|---|---|---|---|
| 3,663,301 A | 5/1972 | Ralston et al. | 136/107 |
| 3,841,913 A | 10/1974 | Anderson | 136/107 |
| 4,004,199 A * | 1/1977 | Pearce et al. | 317/230 |
| 4,047,790 A | 9/1977 | Carino | 339/220 |
| 4,166,359 A | 9/1979 | Domokos | |
| 4,302,517 A | 11/1981 | Dziak | 429/66 |
| 4,520,887 A | 6/1985 | DiFazio | |
| 4,521,668 A | 6/1985 | Osial et al. | |
| 4,670,362 A | 6/1987 | Wiacek et al. | 429/174 |
| 4,957,832 A | 9/1990 | Ruggeberg et al. | 429/164 |
| 4,970,073 A | 11/1990 | Arzur et al. | 429/152 |
| 5,171,647 A * | 12/1992 | Dean et al. | 429/54 |
| 5,180,644 A | 1/1993 | Bresin et al. | |
| 5,194,340 A | 3/1993 | Kosako | 429/1 |
| 5,264,303 A | 11/1993 | McCaffery | 429/99 |
| 5,283,137 A | 2/1994 | Ching | 429/175 |
| 5,376,467 A | 12/1994 | Abe et al. | 429/7 |
| 5,434,017 A | 7/1995 | Berkowitz et al. | 429/94 |
| 5,521,021 A * | 5/1996 | Alexandres et al. | 429/54 |
| 5,529,858 A | 6/1996 | Wicker et al. | 429/149 |
| 5,532,081 A | 7/1996 | DePalma et al. | 429/171 |
| 5,549,985 A | 8/1996 | Heller et al. | 429/157 |
| 5,589,293 A | 12/1996 | Pope et al. | 429/172 |
| 5,672,443 A | 9/1997 | Salisbury | 429/185 |
| 5,750,283 A | 5/1998 | DePalma et al. | 429/56 |
| 5,759,713 A | 6/1998 | DePalma et al. | 429/54 |
| 5,770,328 A | 6/1998 | Friedli et al. | 429/96 |
| 5,776,631 A | 7/1998 | Wu | 429/171 |
| 5,786,980 A | 7/1998 | Evans | 361/502 |

(List continued on next page.)

FOREIGN PATENT DOCUMENTS

| | | |
|---|---|---|
| EP | 1020940 | 7/2000 |
| EP | 1087456 | 3/2001 |
| EP | 1139702 | 10/2001 |
| GB | 1437752 | 6/1976 |
| JP | 7-320709 | 12/1995 |

OTHER PUBLICATIONS

Patent Abstracts of Japan, Publication Date Aug. 4, 1995, Publication No. 07201358.

(List continued on next page.)

*Primary Examiner*—David L Talbott
*Assistant Examiner*—Tuan Dinh
(74) *Attorney, Agent, or Firm*—Hodgson Russ LLP

(57) ABSTRACT

A protection device for an electrical component that has a protective housing and a terminal cap. The protective housing has a base with a contact hole therethrough for accommodating an electrical terminal pin. A projecting perimeter wall extends from the base. A sleeve resides within the perimeter wall, and a terminal cap is captured between the sleeve and the protective housing. A method of assembling a battery and an electrical component with such a protection device is also disclosed.

21 Claims, 4 Drawing Sheets

U.S. PATENT DOCUMENTS

| | | | | |
|---|---|---|---|---|
| 5,821,010 A | | 10/1998 | Taylor | 429/172 |
| 5,843,597 A | | 12/1998 | Getz | 429/174 |
| 5,876,868 A | * | 3/1999 | Tanida | 429/163 |
| 5,977,746 A | * | 11/1999 | Hershberger et al. | 320/12 |
| 6,322,921 B1 | * | 11/2001 | Iwaizono et al. | 429/56 |
| 6,426,867 B1 | * | 7/2002 | Zayatz | 361/626 |

OTHER PUBLICATIONS

Patent Abstracts of Japan, Publication Date Sep. 5, 1997, Publication No. 09231959.

Patent Abstracts of Japan, Publication Date Jan. 29, 1999, Publication No. 11056029.

Patent Abstracts of Japan, Publication No. 09231959; dated Sep. 5, 1997.

Patent Abstracts of Japan, Publication No. 11026029; dated Jan. 29, 1999.

Patent Abstracts of Japan, Publication No. 2000208114; publication date Jul. 28, 2000.

Patent Abstracts of Japan, Publication No. 2000215863; publication date Aug. 4, 2000.

* cited by examiner

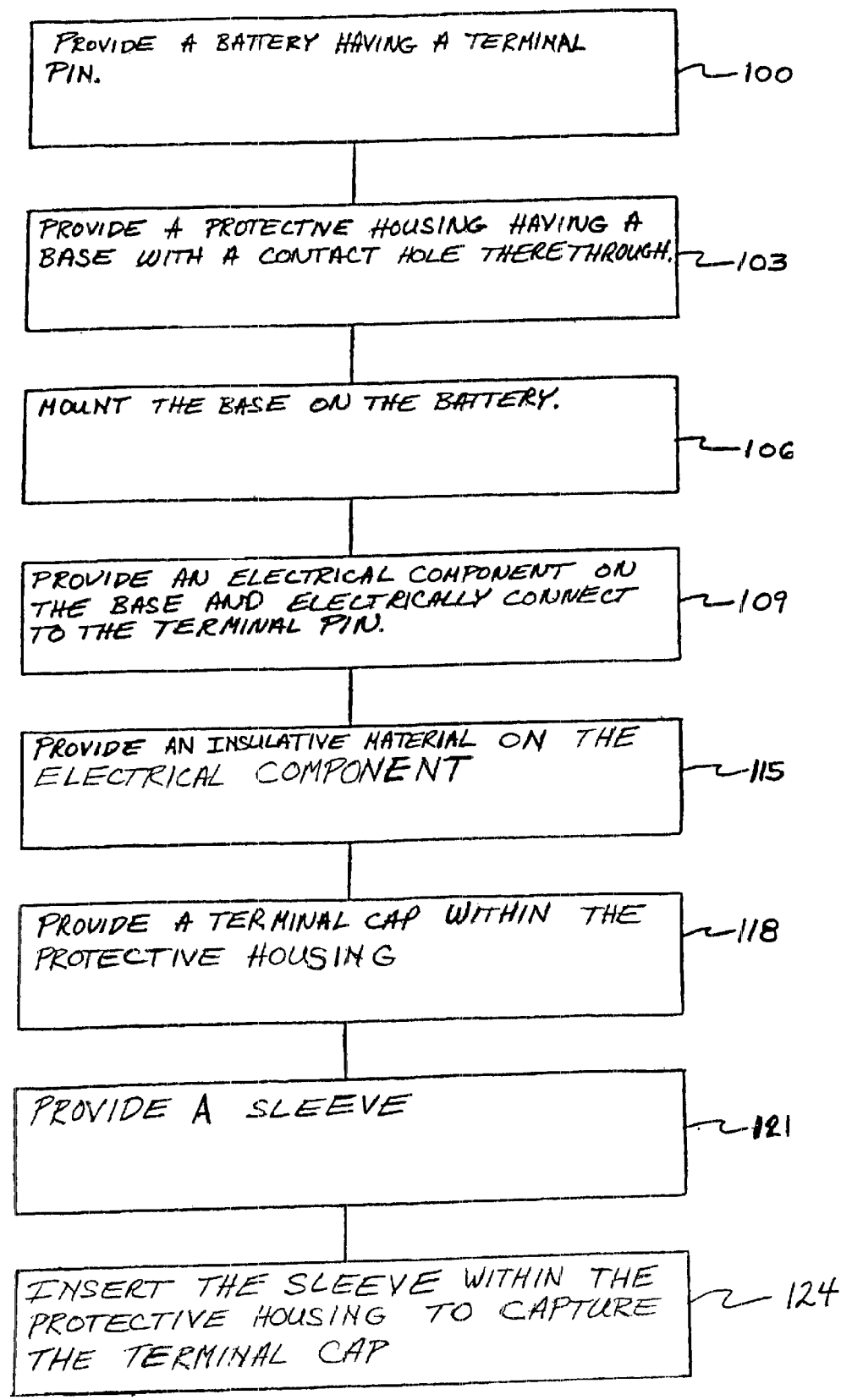

PROTECTION DEVICE HAVING A SLEEVE AND METHOD OF ASSEMBLING A BATTERY WITH A PROTECTION DEVICE AND AN ELECTRICAL COMPONENT

CROSS-REFERENCE TO RELATED APPLICATION

This application is a continuation-in-part of U.S. patent application Ser. No. 09/404,934, which was filed on Sep. 24, 1999 now U.S. Pat. No. 6,205,034.

BACKGROUND OF THE INVENTION

1. Field of the Invention

The present invention relates generally to devices for protecting an electrical component. More specifically, the present invention relates to a protection device for an electrical component connected to a battery.

2. Discussion of Related Art

In the prior art, there are devices for protecting an electrical component, such as a fuse, connected to a battery. Such prior art devices include a cylindrical spacer ring and a terminal cap. The spacer ring is positioned on an end of the battery. The electrical component resides within the spacer ring, and is electrically connected to the battery by at least one, and sometimes two electrical, leads. Another electrical lead of the electrical component is connected to the terminal cap.

To assemble the battery, the electrical component and the prior art spacer ring, an electrically insulating half-moon disk is placed on the battery header. Next, the electrical component is placed on the half-moon disk. Then the first electrical lead of the electrical component is welded to a terminal pin of the battery. If provided, a second electrical lead of the electrical component is welded to the header of the battery. Next, the spacer ring is placed on the battery so as to encircle the electrical component. Then the volume within the spacer ring and above the battery, which is not occupied by the electrical component, is filled with an insulative adhesive material, which may be a polyamide material such as AD-TECH 700 manufactured by Adhesive Technologies, Inc. of Hampton, N.H. (sometimes referred to as "hot-melt"), or which may be an epoxy or silicone material. In doing so, the electrical component is substantially covered with the adhesive material. Only a portion of an electrical lead of the electrical component extends out of and is not entirely covered with the adhesive material. Next, an insulating disk is placed partially into the adhesive material, and a terminal cap is placed over the insulating disk, as well as that portion of the adhesive material which is not covered by the insulating disk. Finally, the exposed electrical lead of the electrical component extending from the adhesive material is welded to the terminal cap.

Such prior art assemblies have disadvantages. For example, the terminal cap can easily disconnect from the rest of the assembly.

SUMMARY OF THE INVENTION

Accordingly, it is an object of the present invention to provide a protection device that will more securely hold the terminal cap to the rest of the assembly.

The foregoing objective is realized by the present invention, which is a protection device for an electrical component that has a protective housing and a terminal cap. The protective housing has a base with a contact hole therethrough for accommodating an electrical terminal pin, and has a projecting perimeter wall extending from the base. A sleeve and a terminal cap reside within the perimeter wall, and the terminal cap is prevented from leaving the protective housing by the sleeve. For example, at least a portion of the terminal cap is captured between a ledge of the protective housing and the sleeve, and a friction or interference fit between the sleeve and the perimeter wall secures the sleeve within the perimeter wall. The protective housing can be used with a power providing device, such as a battery.

In a method according to the present invention, a battery and an electrical component are assembled. The method begins by providing a battery having a terminal pin. Next, a protective housing is provided, the protective housing has a base with a contact hole therethrough, and has a perimeter wall extending from the base. The protective housing is mounted on the battery so the terminal pin extends into the contact hole. Next, an electrical component is provided on the base and electrically connected to the terminal pin. A terminal cap is provided so that the electrical component resides between the terminal cap and the protective housing, and a sleeve is provided to capture the terminal cap. The electrical component is also connected to the terminal cap.

Other objects and advantages of the present invention will become apparent to those skilled in the art from the following detailed description read in conjunction with the attached drawings and claims appended hereto.

BRIEF DESCRIPTION OF THE DRAWINGS

For a fuller understanding of the nature and objects of the invention, reference should be made to the following detailed description taken in conjunction with the accompanying drawings, in which:

FIG. 5 is a flow chart of a method according to the present invention.

BEST MODE FOR CARRYING OUT THE INVENTION

Figure 1:
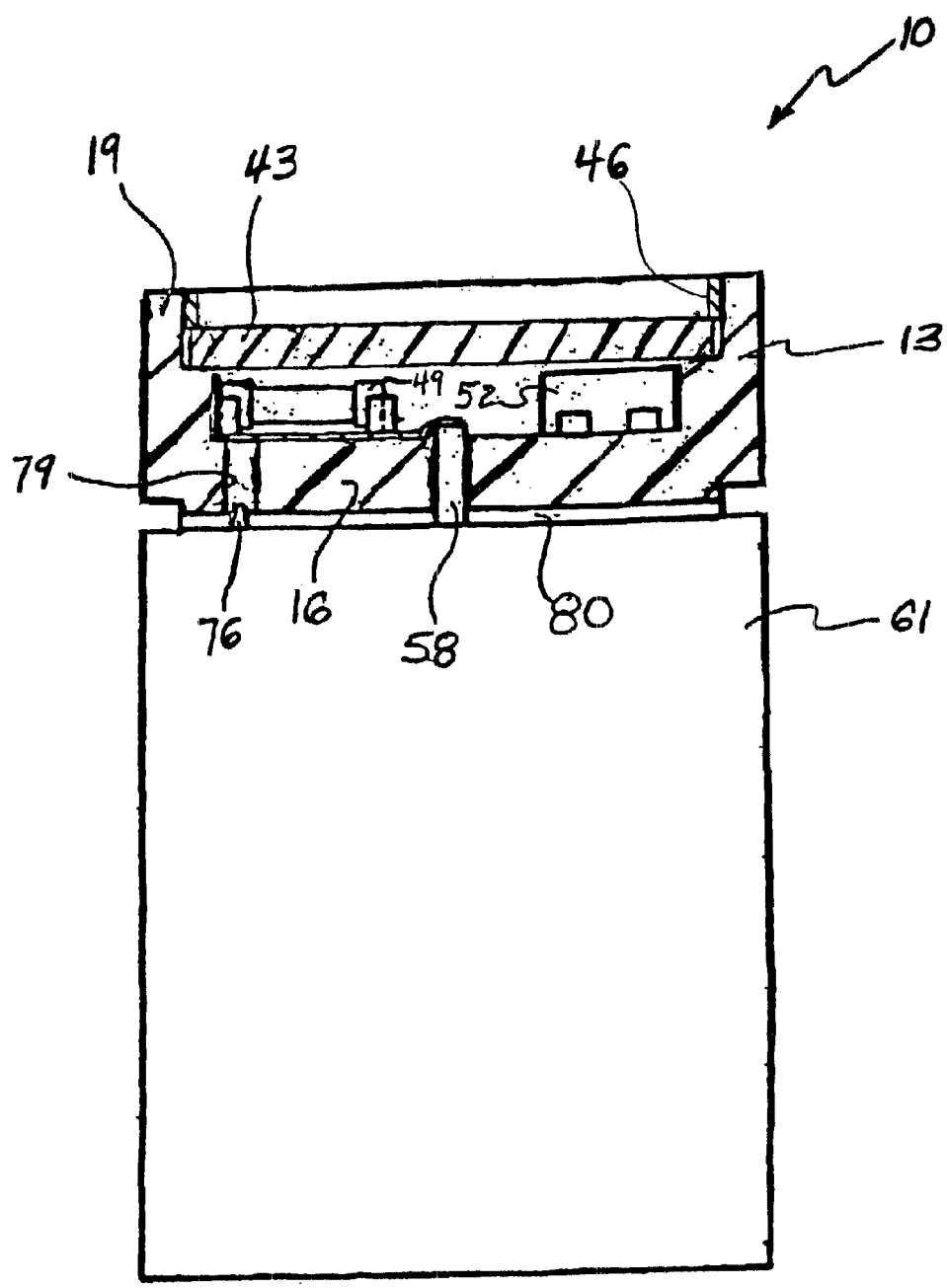
FIG. 1 is a partially cross sectioned side view of a protection device according to the present invention mounted on a battery.
Figure 2:
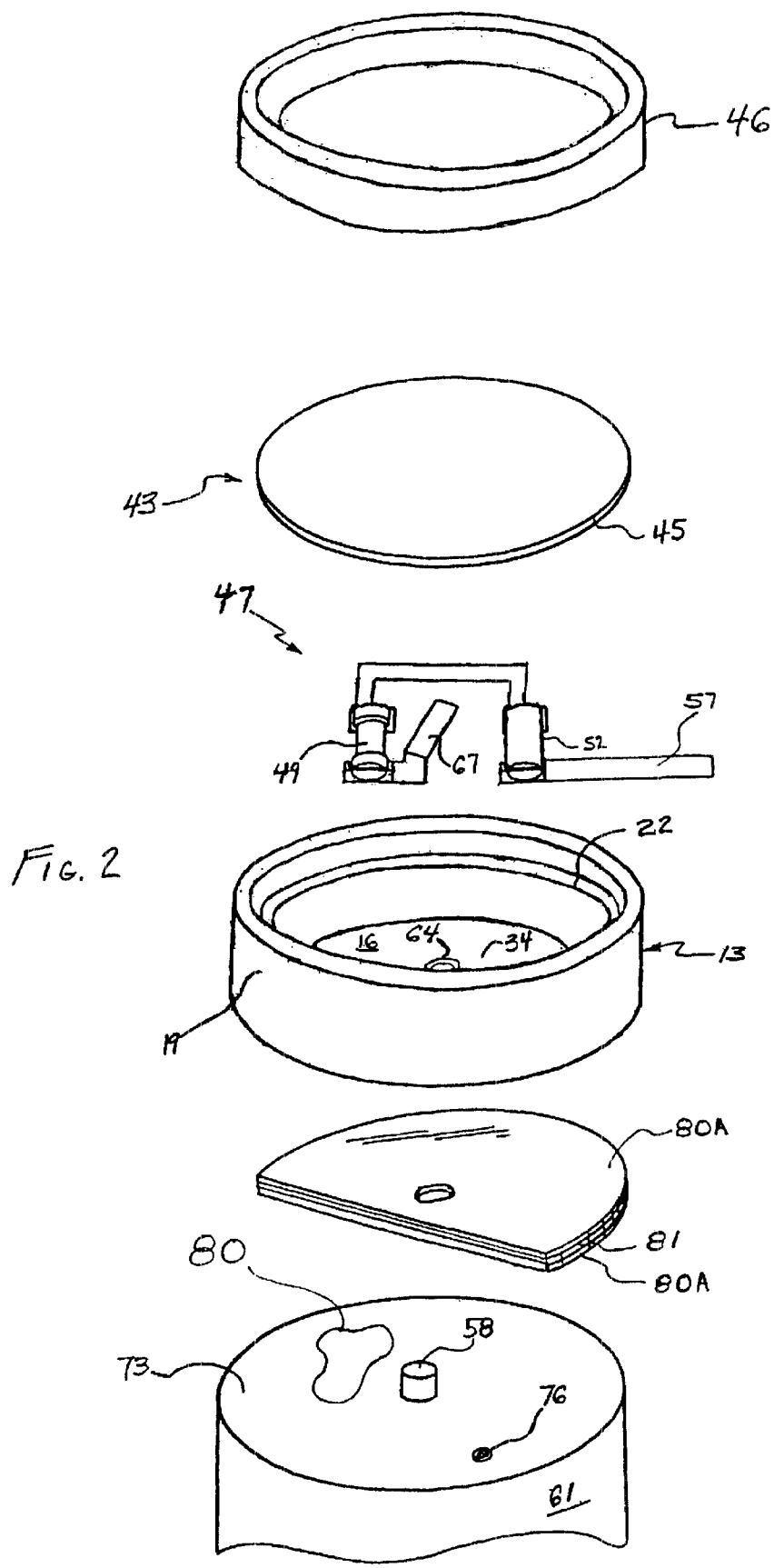
FIG. 2 is an exploded perspective view of the protection device and battery similar to that shown in FIG. 1.
Figure 3:
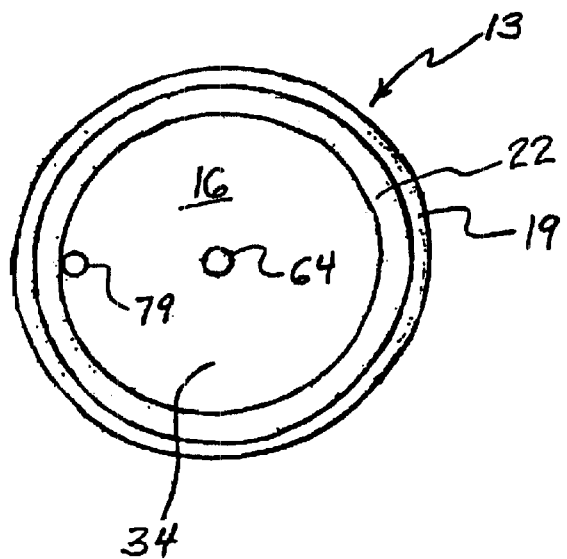
FIG. 3 is a top view of the protective housing shown in FIGS. 1 and 2.

FIGS. 1 and 2 show a protection device 10 according to the present invention. The protection device 10 includes a protective housing 13 (shown also in FIGS. 3 and 4) having a base 16. As shown in FIGS. 1 through 4, extending from the base 16 is a perimeter wall 19, which may have an inner ledge 22. The inner ledge 22 is spaced from the base 16 a distance 25. The perimeter wall 19 extends generally perpendicularly from the base 16. The base 16 includes a primary surface 34.

Materials which are suitable for the protective housing 13 include polyetheretherketone, such as that sold under the tradename Victrex (PEEK) 450-G manufactured by Victrex USA Inc. of Westchester, Pa. and include a polyamide-imide available from DSM Engineering Plastic Products, Inc. of Reading, Pa. as Torlon 4203 PAI. Also suitable for the protective housing 13 and available from DSM Engineering Plastic Products, Inc. is a material marketed under the name Ketron™ PEEK 1000. Another material suitable for the protective housing 13 is liquid crystal polymer, commonly known as Zenite, and available from E. I. du Pont de Nemours and Company. Other materials suitable for the protective housing 13 include 6/6 nylon and glass filled nylon. One such glass filled nylon is sold under the tradename Nylon Zytel 70G33L.

Glass filled nylon is particularly useful when it is desirable to know the temperature of the environment in which the protective housing 13 was placed. It has been shown that glass filled nylon changes color as the exposure temperature increases. By comparing the color of the glass filled nylon to an established color chart, the exposure temperature can be determined.

For example, in one embodiment of the present invention, the protective housing 13 was made from glass filled nylon dyed red with omni rocket red, CC-UN3872, manufactured by the Reed Spectrum company of Holden, Mass. When the environment temperature was at or below 100° C. no detectable color change was observed. However, at 125° C. the color was medium red, at 150° C. the color was dark red, at 175° C. the color was darker red, at 200° C. the color was black, at 225° C. the color was dark black and at 250° C. the color was darker black.

Furthermore, at 225° C. and above, the appearance of the surface of the protective housing 13 made from glass filled nylon changed in ways other than color. At 225° C., the surface of the protective housing 13 was observed to be shinier and grain boundaries could be observed without the aid of a magnifier. At 250° C., the surface of the protective housing 13 was shinier and more grain boundaries could be observed. Similar color changes and surface appearance changes have been noted when the protective housing 13 is made from glass filled nylon that has not been dyed, i.e. has an off-white or light tan color.

The protection device 10 according to the present invention also includes a terminal cap 43 having a perimeter edge 45, and includes a sleeve 46. The sleeve 46 may be made out of the same material as the protective housing 13. In an embodiment of the present invention, when assembled with the protective housing 13, portions of the terminal cap 43 adjacent to the perimeter edge 45 are captured between the sleeve 46 and the inner ledge 22. In one embodiment of the present invention, the sleeve 46 is held relative to the protective housing 13 by a friction or an interference fit. In this manner, the terminal cap 43 is prevented from becoming separated from the protective housing 13.

FIGS. 1 and 2 show the relative position of an electrical component 47 with respect to the protective housing 13 and the terminal cap 43. The electrical component 47 may include a fuse 49 electrically connected to a diode 52. The distance 25 is chosen to allow the electrical component 47 to rest on the primary surface 34 of the base 16 without extending beyond the inner ledge 22. The inner ledge 22 is provided to prevent the terminal cap 43 from contacting any part of the electrical component 47, except for a second lead 57, as described below. The terminal cap 43 is preferably electrically conductive. The second lead 57, is electrically connected to the terminal cap 43, for example, by welding. A terminal pin 58 of a battery 61 extends through a contact hole 64 in the base 16 and is connected to a first lead 67 of the electrical component 47 by welding the first lead 67 to the terminal pin 58.

When manufacturing certain types of batteries 61, electrolyte is introduced through a header 73 of the battery 61 using a fill hole. Once the battery 61 has the proper amount of electrolyte inside, the fill hole is closed, usually by welding a metallic material to the header 73. The metallic material often extends from the header 73 as a metallic projection 76, which is best seen in FIG. 2. Although the metallic projection 76 does not extend far beyond the header 73, since the header 73 serves as a supporting surface for the base 16 and it is desirable to have the base 16 firmly supported by the header 73, an accommodating orifice 79 may be positioned in the base 16 to accommodate the metallic projection 76 therein.

To secure the base 16 to the header 73, a means for fastening may be provided. For example, the base 16 may be fixed relative to the header 73 by placing an adhesive 80 between the base 16 and the header 73. The adhesive 80 may be placed between the base 16 and the header 73 by any of the well known methods, including spraying, pouring, brushing or mixing the adhesive 80 on one or more of the base 16 and the header 73. An acceptable adhesive 80 is cyanoacrylate. Another acceptable adhesive 80 is a pressure sensitive adhesive, such as product number 9500 manufactured by the 3M Company located in Minnetonka, Minn.

The present invention may also include a sheet 81 between the base 16 and the header 73. The sheet 81 allows the protection device 10 to be seated firmly on the header 73, even when the header 73 or the base 16 has irregularities in it. The sheet 81 may be made from an aramid insulating paper, such as Nomex 410™, and may be approximately between 0.002 and 0.005 inches thick. To facilitate assembly of the protection device 10 to the header 73, the sheet 81 may have one or more adhesive layers 80A for bonding to the header 73 and/or the base 16. As shown in FIG. 2, there are adhesive layers 80A on opposite sides of the sheet 81, however, the sheet 81 need not have two adhesive layers 80A, and may have only one or no adhesive layers 80A.

The adhesive layer 80A may be the adhesive material described above. In addition, the 3M Company manufactures a polyester film tape, product number 9731, that can serve as a sheet 81 and adhesive layers 80A. It should be noted that the thickness of the sheet 81 and the adhesive layers 80A shown in FIG. 2 are not drawn to scale in order that the sheet 81 and the adhesive layers 80A can be more easily understood. In one embodiment of the present invention, the adhesive is selected to withstand temperatures above 200° C.

Figure 4:
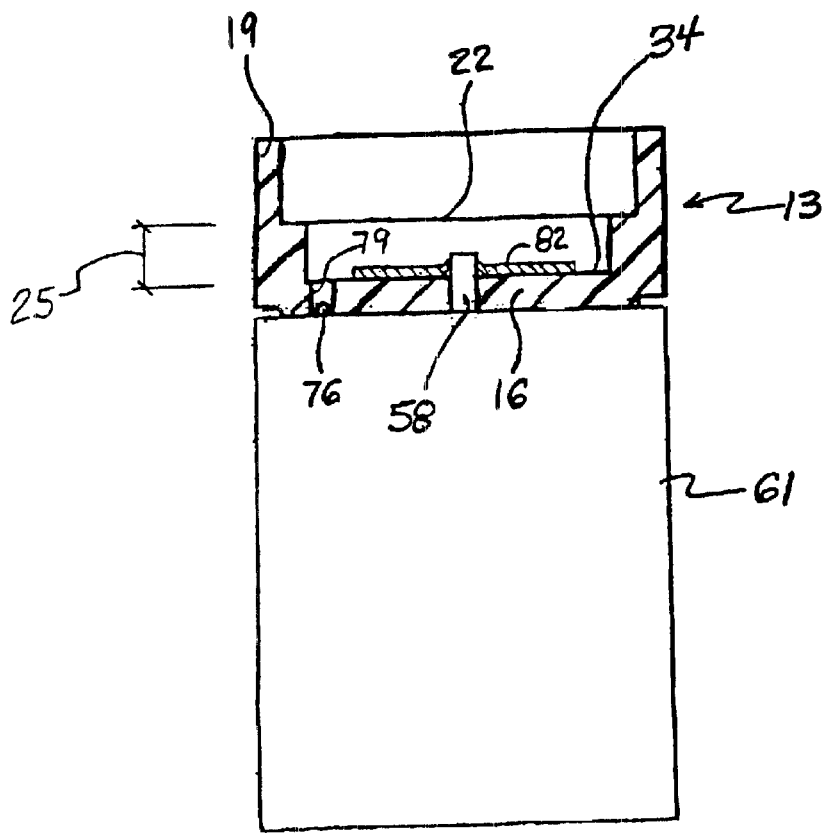
FIG. 4 is a cross sectioned side view of the protective housing shown in FIGS. 1 and 2, mounted on a battery (not in cross section), and including a tinnerman type fastener.

Alternatively, a shrink-wrap may be applied around the battery 61 and the protective housing 13. Such a shrink-wrap is described in U.S. patent application Ser. No. 09/404,934, and the description of the shrink wrap therein is incorporated herein by reference. In addition, as shown in FIG. 4, the means for fastening may be a panel nut 82 which contacts the base 16, and attaches to a portion of the terminal pin 58 extending through the contact hole 64. The panel nut 82 may be made from a non-conductive material such as 6/6 nylon.

FIG. 5 shows steps of a method according to the present invention in which a battery and an electrical component, such as those described above, are assembled. The method begins by providing (step 100) a battery having a terminal pin, and providing (step 103) a protective housing having a base with a contact hole therethrough. The base is mounted (step 106) on the battery so that the terminal pin extends into the contact hole. Next, an electrical component is provided on the base, and the electrical component is electrically connected (step 109) to the terminal pin. Then, a terminal cap is provided (step 118) within the protective housing. Then a sleeve is provided (step 121), and the sleeve is joined to the protective housing (step 124) to capture the terminal cap between the sleeve and the protective housing. In an alternative embodiment of the method according to the present invention, an insulating material, such as the AD-TECH 700 material described above, is provided (step 115) on the electrical component to fix the electrical component within the protective housing. It will now be apparent to those skilled in the art that the insulating material need not have an adhesive quality to it because the sleeve will hold the terminal cap within the protective housing.

Although the present invention has been described with respect to one or more particular embodiments, it will be understood that other embodiments of the present invention may be made without departing from the spirit and scope of the present invention. Hence, the present invention is deemed limited only by the appended claims and the reasonable interpretation thereof.

What is claimed is:

1. A protection device protecting an electrical component, comprising:
   a protective housing having a base with a contact hole therethrough for receiving an electrical terminal pin, and having a projecting perimeter wall extending from the base;
   a sleeve joined to the perimeter wall; and
   a terminal cap captured between the sleeve and the protective housing, wherein the electrical component is permitted to reside between and be protected by the housing and the terminal cap.

2. The protection device of claim 1, wherein the base has an orifice therethrough for receiving a projection on a supporting surface which supports the base.

3. The protection device of claim 1, further including a means for fastening joined to the base and joined to an electrical terminal pin extending through the contact hole.

4. The protection device of claim 1, further comprising an adhesive on the base.

5. The protection device of claim 1, further comprising a sheet between the base and a battery.

6. The protection device of claim 1, wherein the sleeve is held relative to the perimeter wall by an interference fit.

7. The protection device of claim 1, wherein the sleeve is held relative to the perimeter wall by an interference fit.

8. The protection device of claim 3, wherein the means for fastening is a panel nut.

9. The protection device of claim 4, further comprising a sheet having the adhesive thereon.

10. An electrical power providing unit having a battery, an electrical component electrically connected to the battery, and a protection device for protecting the electrical component, the protection device comprising:
    a protective housing having a base with a contact hole therethrough receiving a terminal pin of the battery, and having a projecting perimeter wall extending from the base;
    a sleeve joined to the perimeter wall; and
    a terminal cap captured between the sleeve and the protective housing, wherein the electrical component resides between the base and the terminal cap.

11. The power providing unit of claim 10, wherein the base has an orifice therethrough for receiving a projection on the battery.

12. The power providing unit of claim 10, further including a means for fastening joining the base to the terminal pin of the battery.

13. The power providing unit of claim 10, further comprising an adhesive between the base and the battery.

14. The power providing unit of claim 10, further comprising a sheet between the base and the battery.

15. The power providing unit of claim 11, wherein the projection is a metallic substance bonded to the battery, and resides at least partially in the orifice.

16. The power providing unit of claim 12, wherein the means for fastening is a panel nut.

17. The power providing unit of claim 15, wherein the metallic substance is characterized as having been welded to the battery.

18. A method of assembling a battery and an electrical component, comprising:
    providing a battery having a terminal pin;
    providing a protective housing having a base with a contact hole therethrough, and a perimeter wall;
    placing the protective housing on the battery so that the terminal pin extends into the contact hole;
    providing an electrical component on the base;
    electrically connecting the electrical component to the terminal pin;
    providing a terminal cap within the perimeter wall;
    providing a sleeve;
    inserting the sleeve within the perimeter wall; and
    electrically connecting the terminal cap to the electrical component.

19. The method of claim 18, further comprising providing an insulating material on the electrical component.

20. The method of claim 18, further comprising providing an adhesive between the battery and the protective housing.

21. The method of claim 18, further comprising providing a compressible sheet of material between the battery and the protective housing.

* * * * *

UNITED STATES PATENT AND TRADEMARK OFFICE
CERTIFICATE OF CORRECTION

PATENT NO. : 6,671,187 B1 Page 1 of 1
DATED : December 30, 2003
INVENTOR(S) : Robert Zayatz It is certified that error appears in the above-identified patent and that said Letters Patent is hereby corrected as shown below:

<u>Column 5,</u>
Line 21, please delete "for"; and
Line 41, please delete the entire claim.

Signed and Sealed this

Thirtieth Day of November, 2004

JON W. DUDAS
*Director of the United States Patent and Trademark Office*